US007202109B1

(12) United States Patent
Zakharian et al.

(10) Patent No.: US 7,202,109 B1
(45) Date of Patent: Apr. 10, 2007

(54) INSULATION AND REINFORCEMENT OF INDIVIDUAL BONDING WIRES IN INTEGRATED CIRCUIT PACKAGES

(75) Inventors: David Zakharian, Santa Clara, CA (US); Gary H. Yamashita, San Jose, CA (US); Gary M. Broussard, Tracy, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 112 days.

(21) Appl. No.: 10/993,570

(22) Filed: Nov. 17, 2004

(51) Int. Cl.
 *H01L 21/50* (2006.01)
(52) U.S. Cl. .................... 438/118; 438/119
(58) Field of Classification Search ............ 438/118, 438/119
 See application file for complete search history.

(56) References Cited

U.S. PATENT DOCUMENTS

| 5,396,104 | A | * | 3/1995 | Kimura ................. 257/784 |
| 5,455,745 | A | | 10/1995 | Weiler et al. |
| 5,527,742 | A | | 6/1996 | Weiler et al. |
| 5,950,100 | A | * | 9/1999 | Shingai ................. 438/617 |
| 6,033,937 | A | * | 3/2000 | Manteghi ............... 438/124 |
| 6,040,633 | A | * | 3/2000 | Manteghi ............... 257/784 |
| 6,177,726 | B1 | * | 1/2001 | Manteghi ............... 257/725 |
| 6,445,060 | B1 | * | 9/2002 | Courtenay et al. ...... 257/666 |
| 2001/0017221 | A1 | * | 8/2001 | Horiuchi et al. ........ 174/260 |

FOREIGN PATENT DOCUMENTS

| JP | 59-123249 A | * | 7/1984 |
| JP | 5-67708 A | * | 3/1993 |
| JP | 2000-031195 A | * | 1/2000 |
| JP | 2004-2282021 A | * | 10/2004 |

* cited by examiner

*Primary Examiner*—Ngân V. Ngô
(74) *Attorney, Agent, or Firm*—Beyer Weaver LLP (57) ABSTRACT

In an integrated circuit package, a method for insulation and reinforcement of individual bonding wires in an integrated circuit package. Using an airbrush, bonding wires are sprayed and coated with an insulating material prior to the molding process. Mold flow induced short rejects are eliminated as a result of: (a) Electrically insulating the bonding wires by coating them with an insulating mixture; (b) Physically isolating the bonding wires as a result of bead formation around individual bonding wires, with the insulating beads acting as contact barriers between the bonding wires; and (c) Enhancing the structural rigidity of the bonding wires as a result of the coating. Reinforcement and separation of bonding wires also reduces inductive coupling and/or crosstalk interference due to proximity of bonding wires.

11 Claims, 7 Drawing Sheets

INSULATION AND REINFORCEMENT OF INDIVIDUAL BONDING WIRES IN INTEGRATED CIRCUIT PACKAGES

BACKGROUND OF THE INVENTION

The present invention relates generally to wire bonded integrated circuit packages and, more particularly, to methods and arrangements for isolation and reinforcement of individual bonding wires in integrated circuit packages.

In a wire bonded integrated circuit package, a die is attached and wire bonded to a lead frame (or other substrate) and then molded. During the molding process, the flow of the mold may displace some bonding wires, a phenomenon commonly referred to as "wire sweep". As a result of wire sweep, some displaced bonding wires may come in contact with other bonding wires and produce short circuits. Wire sweep generally causes a decrease in package yields, since packages with shorts are rejected ("short rejects"). In other situations, wire sweep may push adjacent bonding wires closer together than is desired even though they do not actually touch. This can lead to increased inductive coupling and/or crosstalk interference between adjacent bonding wires, which can decrease the performance of the resulting packaged integrated circuit and lead to further reductions in package yields.

One approach to addressing the wire sweep problem has been to insulate the bonding wires before molding. By way of example, U.S. Pat. Nos. 5,455,745 and 5,527,742 describe methods of insulating bonding wires. Although the existing wire insulation techniques work well, in the semiconductor industry, there are continuing efforts to improve packaging techniques and/or reduce costs.

SUMMARY OF THE INVENTION

To achieve the foregoing and other objects and according to the purpose of the present invention, a method for insulating and reinforcing individual bonding wires in integrated circuit packages is disclosed. In one embodiment, bonding wires are coated with an insulating material prior to the molding process. The insulating coating comprises a coating mixture that is applied to the bonding wires using an airbrush. The method enables assembly of packages with bonding wires exceeding industry specification for wire length (per wire diameter) as well as development of inboard and stacked bonding applications by eliminating mold flow induced short rejects. This is accomplished by: (a) Electrically insulating the bonding wires by coating them with an insulating mixture; (b) physically isolating the bonding wires as a result of bead formation around individual bonding wires, with the insulating beads acting as contact barriers as well as reducing the likelihood and intensity of inductive coupling and/or crosstalk interference between adjacent bonding wires due to proximity of bonding wires; and (c) enhancing the structural rigidity of the bonding wires as a result of the coating.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

Methods for isolation and reinforcement of individual bonding wires in integrated circuit packages are described below. In the following description, numerous specific details are set forth in order to provide a thorough understanding of the present invention. It will be understood, however, by one skilled in the art, that the present invention may be practiced without some or all of these specific details. In other instances, well known process operations have not been described in detail in order not to unnecessarily obscure the present invention.

Figure 1:
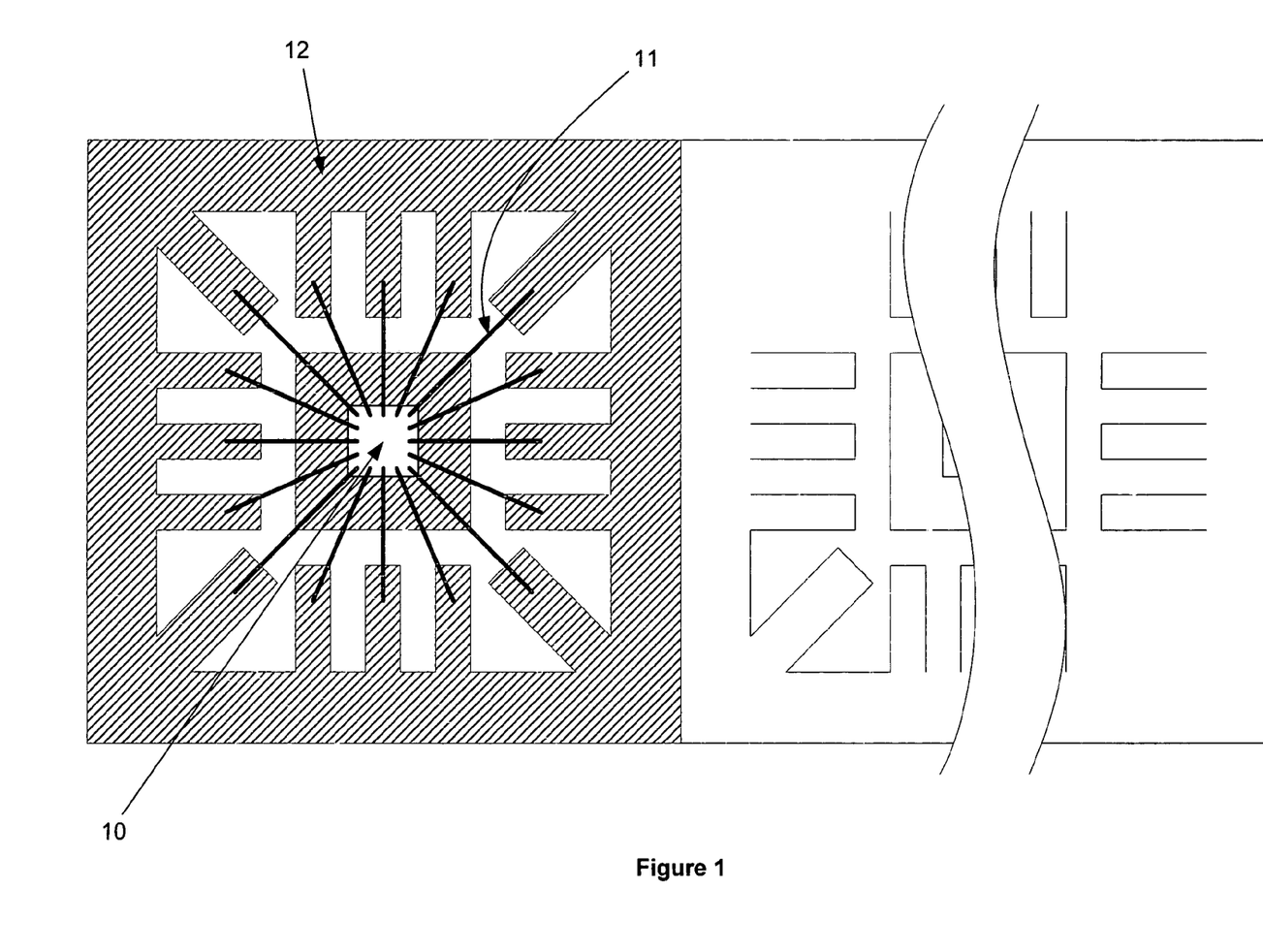
FIG. 1 is a diagrammatic top view of a wire bonded lead frame or substrate, in accordance with an embodiment of the present invention.

FIG. 1 is a diagrammatic top view of a wire bonded lead frame 12, in accordance with an embodiment of the present invention. Lead frame 12 is a sheet metal framework upon which an integrated circuit (die) 10 is attached. The die 10 is wire bonded to the lead frame 12 using bonding wires 11, and then molded or otherwise encased using plastic molding, epoxy, ceramic or metallic casing, or other protective material. The result is an integrated circuit package that provides protection for the die 10 as well as connection from the die 10 to the next higher level of integration.

During the molding process, a phenomenon commonly referred to as "wire sweep" may occur, wherein the mold flow causes displacement of some of the bonding wires 11. Such displaced bonding wires 11 may end up touching other bonding wires 11 and produce short-circuits. Wire sweep generally causes a decrease in package yields, since packages having shorts between bonding wires are rejected. Wire sweep is a problem especially when the bonding wires 11 are close together and/or have large wire length to wire diameter ratio, as is the case for example with a die 10 having high pin-count.

In accordance with a first aspect of the present invention the bonding wires 11 are electrically insulated using a coating applied prior to the molding process. The insulating coating reduces the likelihood of short-circuits due to the bonding wires 11 coming in contact with electrically conducting elements in their environment. In accordance with a second aspect of the present invention, the bonding wires 11 are kept physically separate from each other with the help of beads made of insulating material and formed on the bonding wires 11. The beads 11 physically isolate the bonding wires 11 by keeping them at a distance from adjacent bonding wires 11, thereby decreasing inductive coupling and/or crosstalk interference between adjacent bonding wires 11. In accordance with a third aspect of the present invention, the structural rigidity of the bonding wires 11 is enhanced by virtue of the insulating coating, thereby reducing the tendency of the bonding wires 11 to move with the flow of the mold.

Figure 4:
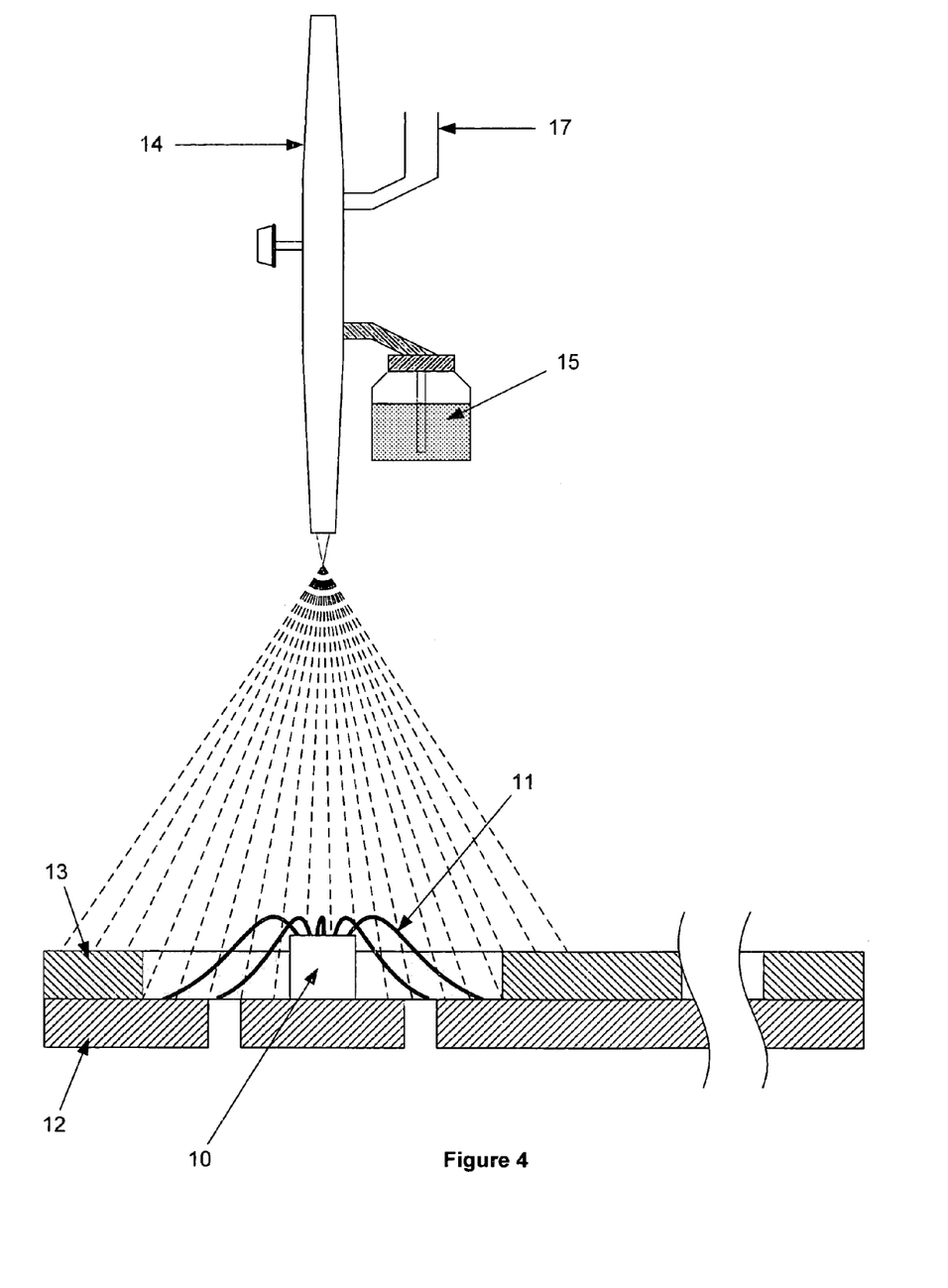
FIG. 4 is a diagrammatic cross-section view showing an airbrush as it sprays an insulating mixture onto bonding wires through a mask overlay, in accordance with an embodiment of the present invention.

An airbrush 14 is used to spray an insulating material onto the bonding wires 11 in order to coat them. If the viscosity of the insulating material is too high to result in an even spray mist and flow when using the airbrush 14, the insulating material may be mixed with a solvent in order to reduce the viscosity and provide better flow. By way of example, an insulating mixture 15 of one part Dow Corning 3-1965 conformal coating (acting as insulator) and one to two parts Dow Corning OS-20 low molecular weight siloxane (recommended solvent for Dow Corning 3-1965) has been found to work well. As should be apparent to one of ordinary skill in the art, other insulators and solvents in other mixing ratios can be used as well.

Figure 2:
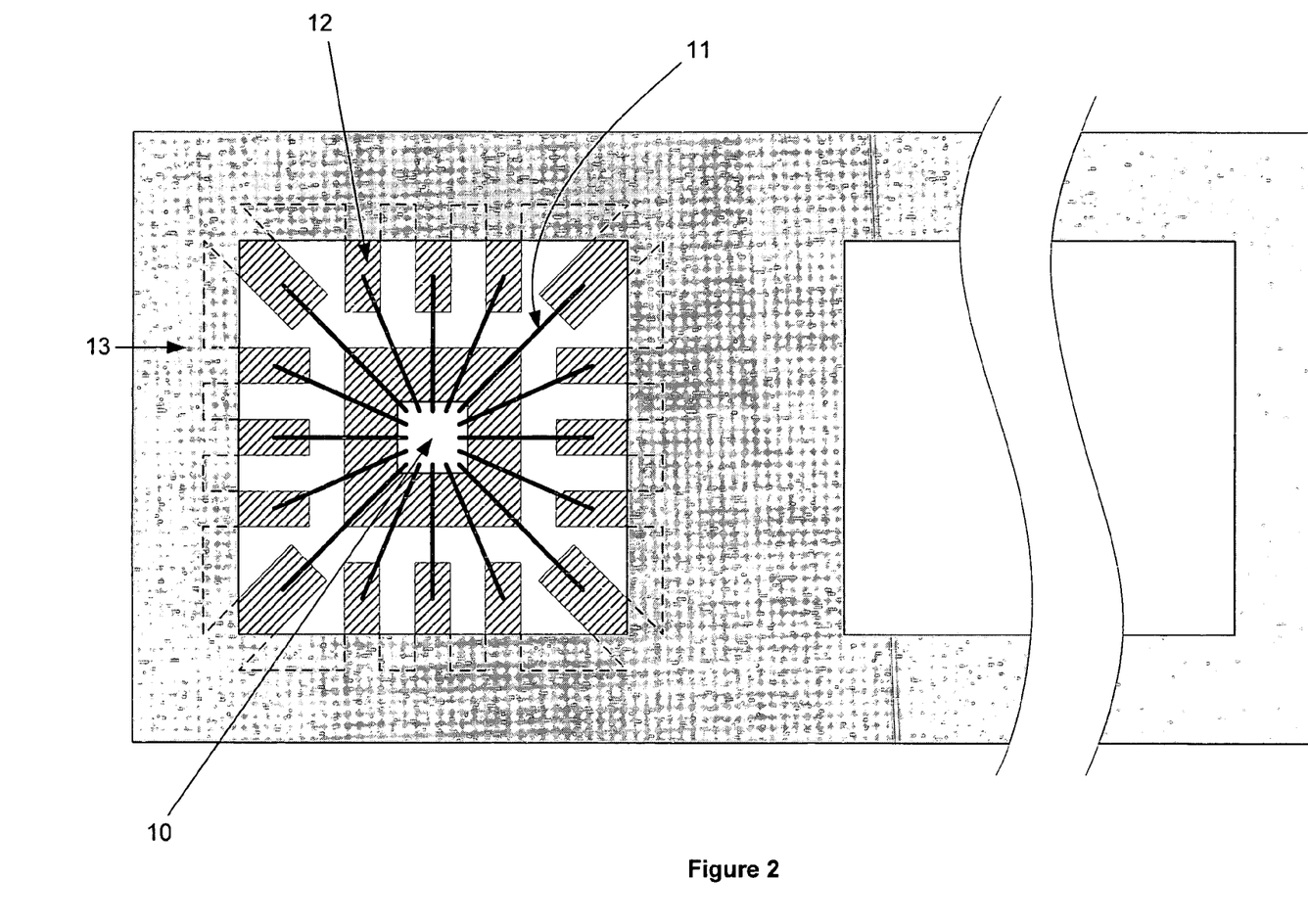
FIG. 2 is a diagrammatic top view of a mask overlay placed over a wire bonded lead frame or substrate, in accordance with an embodiment of the present invention.
Figure 3:
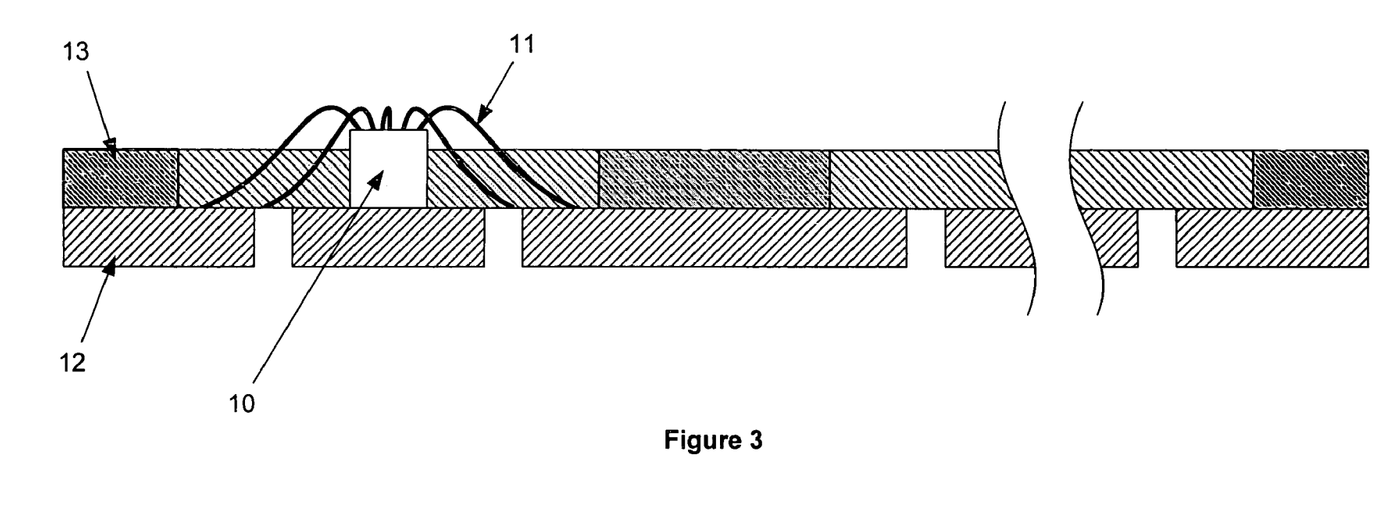
FIG. 3 is a diagrammatic cross-section view of a mask overlay placed over a wire bonded lead frame or substrate, in accordance with an embodiment of the present invention.

In a preferred embodiment, a mask overlay 13 is placed over the package prior to spraying the insulating material 15 onto the bonding wires 11. FIG. 2 is a diagrammatic top view and FIG. 3 is a diagrammatic cross-section view of a mask overlay 13 placed over a wire bonded lead frame 12, in accordance with an embodiment of the present invention. The mask overlay 13 exposes the bonding wires 11 while covering the package edges around the bonding wires 11, thereby limiting spraying to the exposed surfaces and allowing the mold to adhere to the unsprayed package edges. The mask overlay 13 comprises material thick enough to prevent spray penetration. By way of example, thick paper has been found to work well as a mask overlay 13. It may be convenient for the mask overlay 13 to be made out of plastic, glass, metal or other such reusable material. Note that although a mask overlay 13 is preferred, its use is not required in the present invention.

The pressure of the compressed air source 17 for the airbrush 14 is set at a compressed air pressure of about 15–25 psi (with atmospheric pressure serving as reference pressure). By way of example, a pressure of about 20 psi has been found to work well. The airbrush 14 is of a conventional type, available for example at art or craft supply stores. With the mask overlay 13 covering the lead frame 12, the airbrush 14 is held perpendicularly above the mask overlay 13 at a distance appropriate for uniform spraying of the bonding wires 11, for example at a distance of about 2–10 inches. By way of example, a distance of about 4 inches has been found to work well. The airbrush 14 is then activated to spray and coat the bonding wires 11 with the insulating mixture 15.

Aided by adhesion and surface tension, the sprayed mixture 15 covers the bonding wires 11 and as a result insulates them electrically and reinforces them mechanically. The result is increased mechanical resistance to wire sweep, as well as electrical insulation in the case that wire sweep does put one or more bonding wires 11 in contact with other bonding wires 111 or with other electrically conducting surfaces. Note that although some exposed surfaces of the die 10 and the lead frame 12 do get sprayed and insulated along with the bonding wires 11, this does not adversely affect the properties or the usability of the package.

Figure 5:
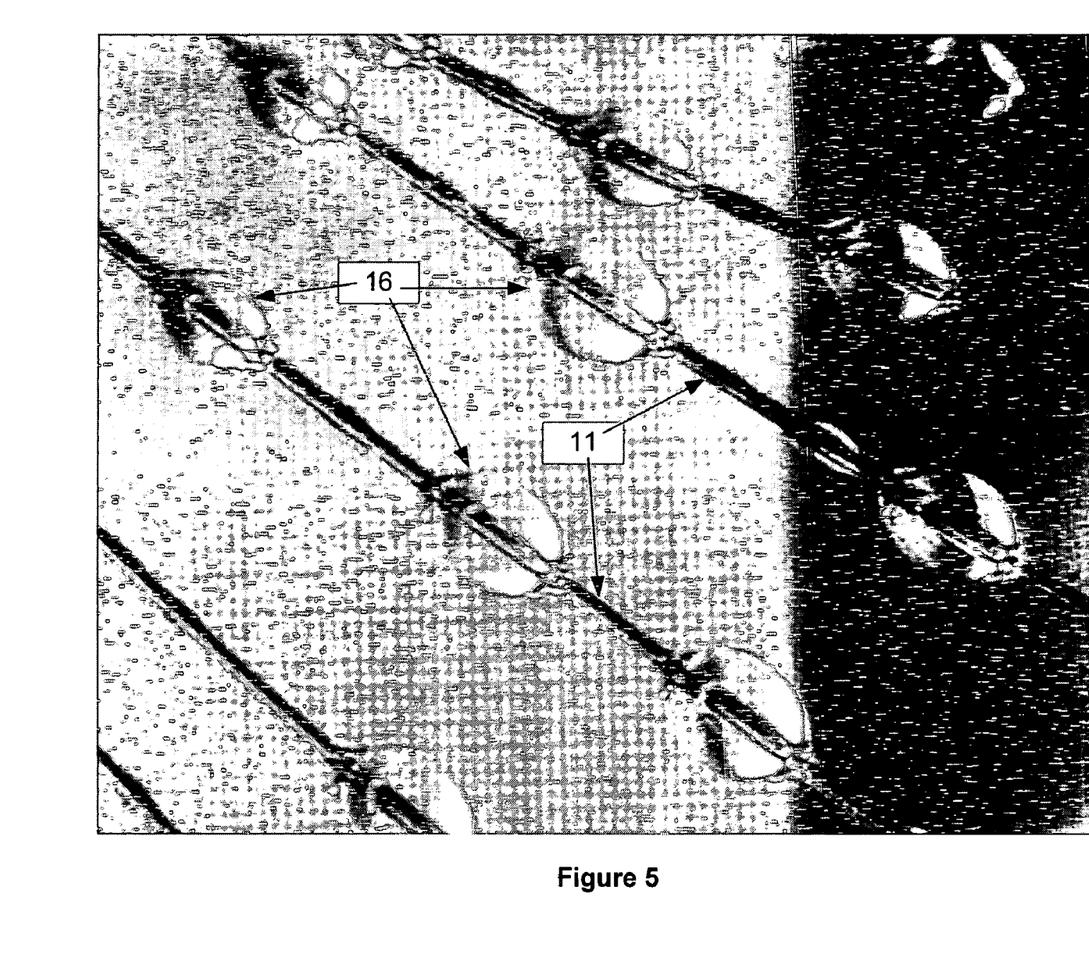
FIG. 5 is a photograph showing beads formed on coated bonding wires, in accordance with an embodiment of the present invention.

As a further result of the adhesion and surface tension of the insulating mixture 15, the mixture 15 forms beads 16 on the bonding wires 11. FIG. 5 is a photograph depicting several beads 16 formed on coated bonding wires 11. Should the bonding wires 11 get displaced as a result of wire sweep, the beads 16 act as contact barriers and physically keep the bonding wires 11 at a distance from other bonding wires 11 and other surfaces, preventing shorts as well as reducing the likelihood and intensity of inductive coupling and/or crosstalk interference between adjacent bonding wires 11 due to proximity of bonding wires 11. In the event that a portion of a bonding wire 11 is inadvertently left exposed, the beads 16 help reduce the probability of physical contact.

Figure 6:
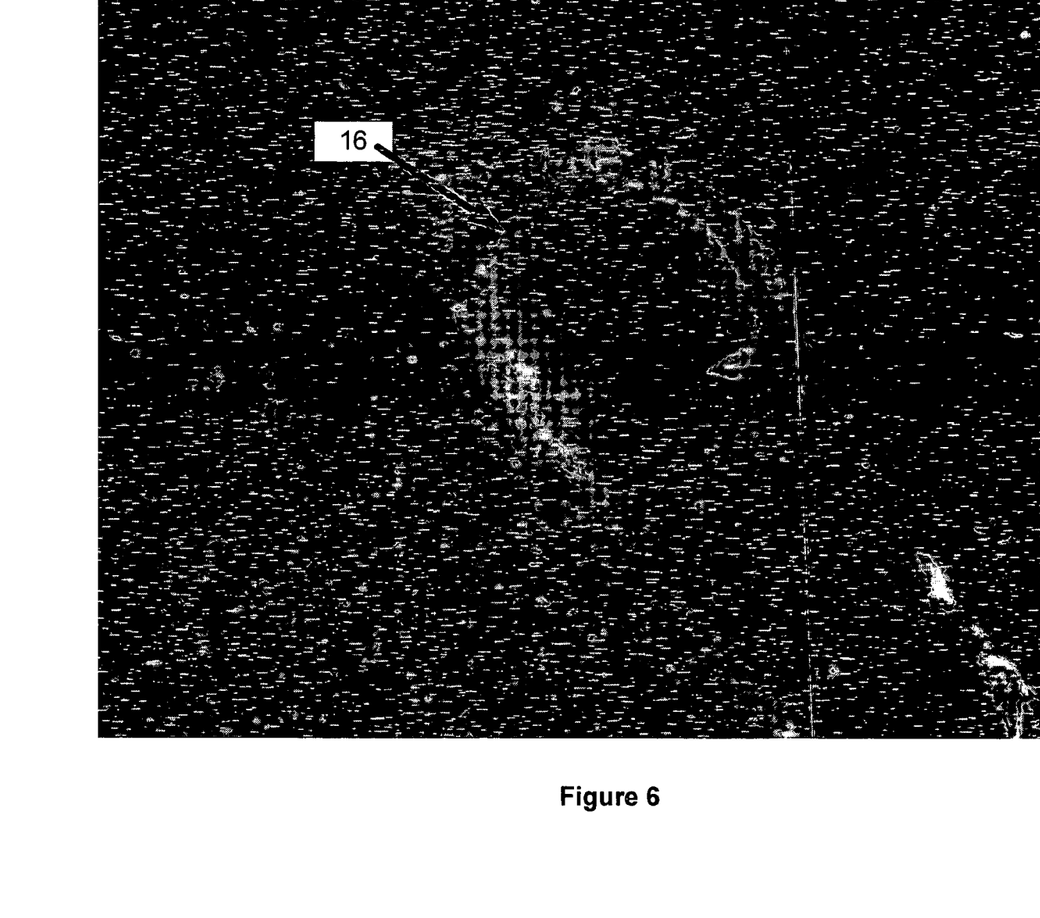
FIG. 6 is a photograph showing a single bead formed on a bonding wire and acting as a contact barrier, in accordance with an embodiment of the present invention.

If during the spaying of the insulating mixture 15 the bonding wires 11 are sufficiently close to each other, beads 16 may form between adjacent bonding wires 11. An example is shown in FIG. 6, showing a photograph of a bead 16 formed between two adjacent bonding wires 11. Such beads 16 keep adjacent bonding wires 11 separated and at a distance from each other.

After completing the spraying process, the mask overlay 13 can be removed. At about room temperature (20°–25° C.), the solvent will evaporate and the insulating mixture will cure after a period of a few hours. By way of example, the above described mixture of one part Dow Corning 3-1965 conformal coating (insulator) and one to two parts Dow Corning OS-20 DC low molecular weight siloxane (solvent) has been found to cure at room temperature in about one hour. Optionally, this process can be accelerated by curing the mixture at a temperature of about 50° to 80° C. for a period of about 5 to 15 minutes. By way of example, the curing has been found to complete in 10 minutes at 65° C. After the insulating mixture 15 is cured, the package can undergo molding without suffering mold flow induced shorts and with reduced likelihood of inductive coupling and/or crosstalk interference due to bonding wire proximity.

Figure 7:
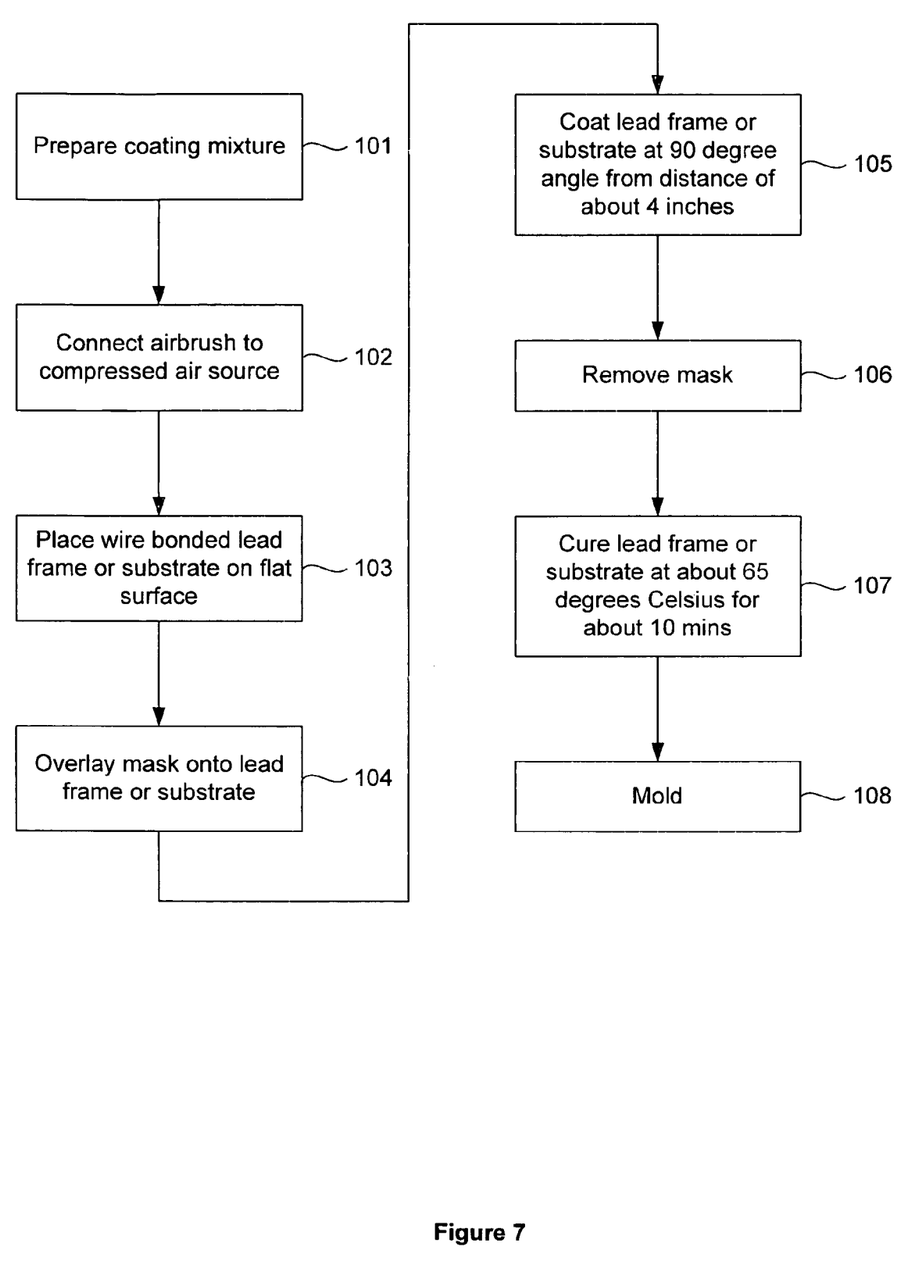
FIG. 7 is a flowchart illustrating a process of coating a wire bonded lead frame in order to isolate and reinforce individual bonding wires in integrated circuit packages, in accordance with one embodiment of the present invention.

FIG. 7 is a flowchart illustrating a process of coating a wire bonded lead frame in order to isolate and reinforce individual bonding wires to eliminate mold flow induced short rejects, in accordance with one embodiment of the present invention. After preparing 101 the coating mixture 15 and connecting 102 the airbrush 14 to a compressed air source 17, the wire bonded lead frame 12 (or other substrate for attaching the die 10) is placed 103 on a flat surface and covered 104 with a mask overlay 13. The wire bonded lead frame 12 is sprayed and coated 105 using the airbrush 14 held perpendicularly above and at a distance of about 4 inches to the lead frame 12. After removing 106 the mask overlay 13, the insulating mixture 15 is optionally cured 107, and the package is ready to undergo a molding process 108.

The invention has been described in the context of insulating bonding wires 11 in order to eliminate mold flow induced shorts and decrease inductive coupling and/or crosstalk interference between adjacent bonding wires. However, it should be appreciated that the same techniques can be used to insulate the bonding wires 11 and/or the die 10 from their ambient environment, for example in a package where the wire bonded die 10 and lead frame 12 are sealed by the attachment of a lid. In such a case, insulating the die 10 and the bonding wires 11 protects them from the ambient air, or from accidental bonding wire 11 displacement by hand or by a tool, such as might happen when removing the lid. Another example is a test package wherein the wire bonded die 10 and lead frame 12 are not molded, but are instead passed on for testing or for further work. In general, insulation of the bonding wires 11, the die 10 and/or the lead frame 12 protects them from harmful or unwanted interaction with their environment. It should also be appreciated that the described techniques can be used with packages comprising a die wire bonded to an electrical component (such as another die) or a substrate other than a lead frame, as well as with stacked die packages. It should be further appreciated that the same techniques can be used with integrated circuit packages having as protective casing molded plastic material, dispensed epoxy, ceramic or metallic casing, or other similar protective casing.

Foregoing described embodiments of the invention are provided as illustrations and descriptions. They are not intended to limit the invention to precise form described. Other variations and embodiments are possible in light of above teachings, and it is thus intended that the scope of the invention not be limited by this Detailed Description, but rather by Claims following.

We claim:

1. In an integrated circuit package having an integrated circuit die electrically connected to a lead frame or substrate or electrical component via bonding wires, a method for electrically insulating the bonding wires, the method comprising:
   spraying an insulating material onto the bonding wires using an airbrush, wherein the insulating material forms a plurality of beads on the bonding wires, the beads forming as a result of an adhesion and a surface tension of the insulating material, wherein the insulating material electrically insulates the bonding wires from each other and wherein the plurality of beads are suitable for physically separating the bonding wires from each other; and
   molding the integrated circuit package;
   thereby preventing short circuits between bonding wires due to mold flow induced displacement of the bonding wires.

2. A method as recited in claim 1, further comprising:
   placing a mask overlay over the integrated circuit package, the mask overlay for exposing the bonding wires while covering package edges surrounding the bonding wires, thereby limiting spraying to exposed surfaces and allowing mold to adhere to unsprayed package edges.

3. A method as recited in claim 1, wherein the insulating material comprises a mixture of an insulator and a solvent, the solvent for reducing a viscosity of the insulator in order to achieve better flow when using the airbrush.

4. In an integrated circuit package having an integrated circuit die electrically connected to a lead frame or substrate or electrical component via bonding wires, a method for electrically insulating the bonding wires, the method comprising:
   spraying an insulating material onto the bonding wires using an airbrush, wherein the insulating material electrically insulates the bonding wires from each other and comprises a mixture of an insulator and a solvent, the solvent for reducing a viscosity of the insulator in order to achieve better flow when using the airbrush and wherein the mixture comprises one to two parts of the insulator and one part of the solvent, the insulator comprises Dow Corning 3-1965 conformal coat, and the solvent comprises Dow Corning OS-20 low molecular weight siloxane; and
   molding the integrated circuit package;
   thereby preventing short circuits between bonding wires due to mold flow induced displacement of the bonding wires.

5. A method as recited in claim 1, further comprising:
   curing the insulating material at a temperature in the range of approximately 50° to 80° C. for a period in the range of approximately 5 to 15 minutes.

6. In an integrated circuit package having an integrated circuit die electrically connected to a lead frame or substrate or electrical component via bonding wires, a method for electrically insulating the bonding wires, the method comprising:
   forming a plurality of beads on the bonding wires, the beads comprising an insulating material and forming as a result of an adhesion and a surface tension of the insulating material, the beads for physically keeping the bonding wires at a distance from each other; and
   molding the integrated circuit package;
   thereby preventing short circuits between bonding wires due to mold flow induced displacement of the bonding wires.

7. A method as recited in claim 6, wherein the insulating material is sprayed onto the bonding wires using an airbrush, thereby forming beads on the bonding wires.

8. A method as recited in claim 7, further comprising:
   placing a mask overlay over the integrated circuit package, the mask overlay for exposing the bonding wires while covering package edges surrounding the bonding wires, thereby limiting spraying to exposed surfaces and allowing mold to adhere to unsprayed package edges.

9. A method as recited in claim 7, wherein the insulating material comprises a mixture of an insulator and a solvent, the solvent for reducing a viscosity of the insulator in order to achieve better flow when using the airbrush.

10. A method as recited in claim 9, wherein the mixture comprises one to two parts of the insulator and one part of the solvent, the insulator comprises Dow Corning 3-1965 conformal coating, and the solvent comprises Dow Corning OS-20 low molecular weight siloxane.

11. A method as recited in claim 6, further comprising:
    curing the insulating material at a temperature in the range of approximately 50° to 80° C. for a period in the range of approximately 5 to 15 minutes.

* * * * *